United States Patent
Chaudhry et al.

(10) Patent No.: US 7,144,775 B2
(45) Date of Patent: Dec. 5, 2006

(54) LOW-VOLTAGE SINGLE-LAYER POLYSILICON EEPROM MEMORY CELL

(75) Inventors: Muhammad I. Chaudhry, Colorado Springs, CO (US); Damian A. Carver, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 112 days.

(21) Appl. No.: 10/848,763

(22) Filed: May 18, 2004

(65) Prior Publication Data
US 2005/0258492 A1    Nov. 24, 2005

(51) Int. Cl.
*H01L 21/336* (2006.01)

(52) U.S. Cl. ............ 438/258; 438/157; 438/223; 438/238; 438/257; 438/323; 257/314; 257/315; 257/316; 257/318

(58) Field of Classification Search ........... 438/164, 438/223, 258
See application file for complete search history.

(56) References Cited

U.S. PATENT DOCUMENTS

| | | | | |
|---|---|---|---|---|
| 5,600,593 A | | 2/1997 | Fong | 365/185.19 |
| 5,904,524 A | * | 5/1999 | Smolen | 438/264 |
| 6,022,770 A | * | 2/2000 | Hook et al. | 438/211 |
| 6,346,457 B1 | * | 2/2002 | Kawano | 438/424 |
| 6,449,192 B1 | | 9/2002 | Otsuka | 365/185.23 |
| 2005/0017285 A1 | * | 1/2005 | Tzeng et al. | 257/301 |

OTHER PUBLICATIONS

Wolf et al, Silicon Processing for the VLSI Era: vol. 1, Lattice Press: Sunset Beach, CA, 2000, pp. 225-226 and 830-831.*

* cited by examiner

*Primary Examiner*—Carl Whitehead, Jr.
*Assistant Examiner*—Colleen E. Rodgers
(74) *Attorney, Agent, or Firm*—Schneck & Schneck; Thomas Schneck

(57) ABSTRACT

The present invention is an electronic memory cell and a method for the cell's fabrication comprising a first transistor configured to be coupled to a bit line. The first transistor has an essentially zero voltage drop when activated and is configured to control an operation of the memory cell. A second transistor is configured to operate as a memory transistor and is coupled to the first transistor. The second transistor is further configured to be programmable with a voltage about equal to a voltage on the bit line.

12 Claims, 4 Drawing Sheets

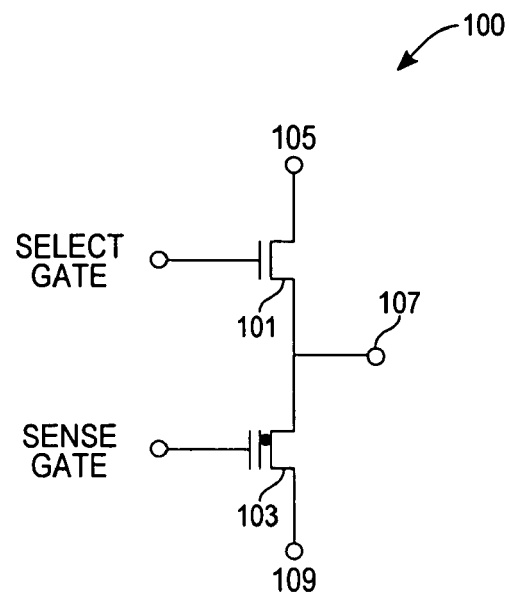
*Fig._1 (Prior Art)*
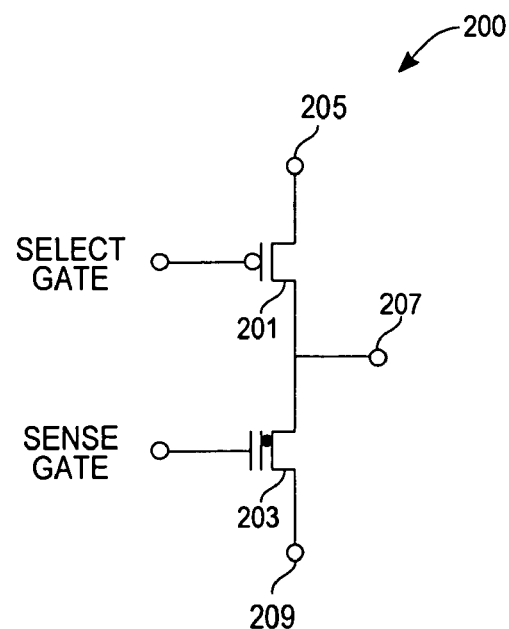
*Fig._2*

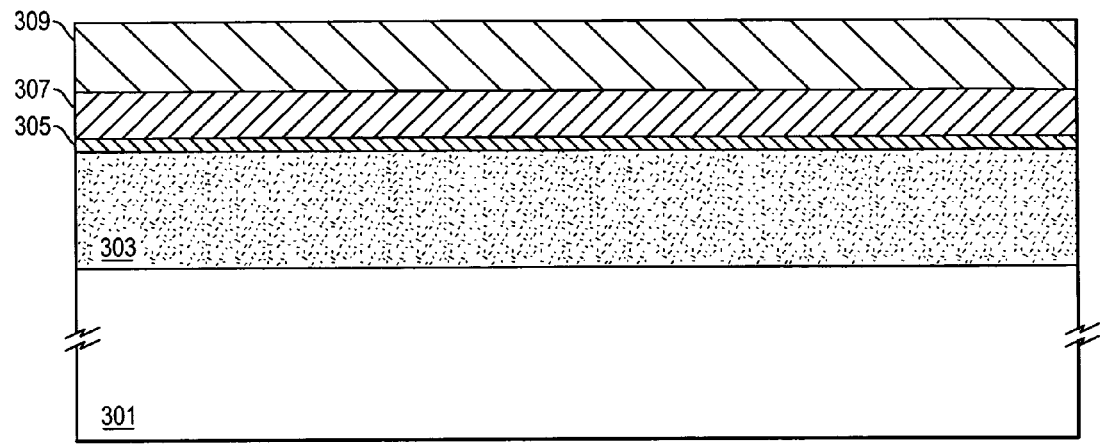
Fig._3
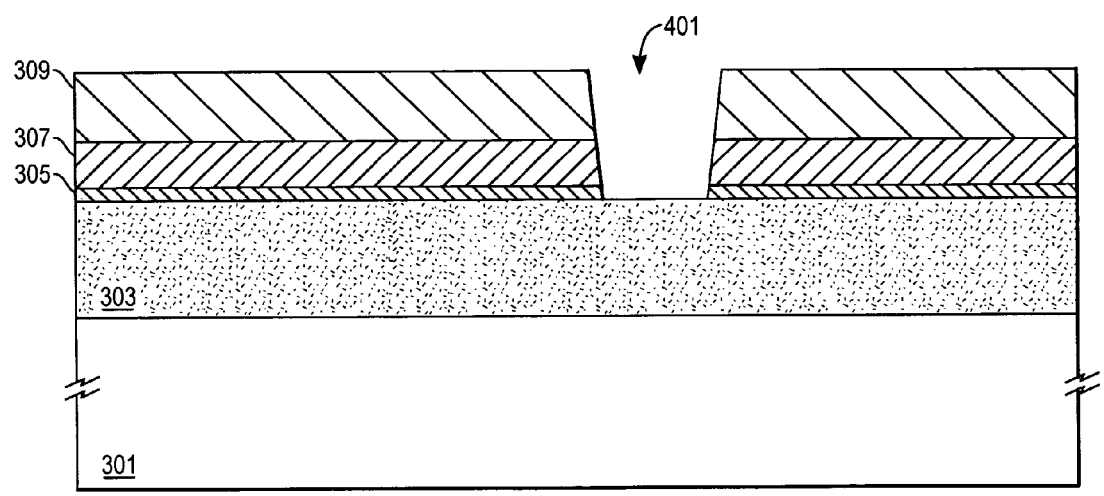
Fig._4

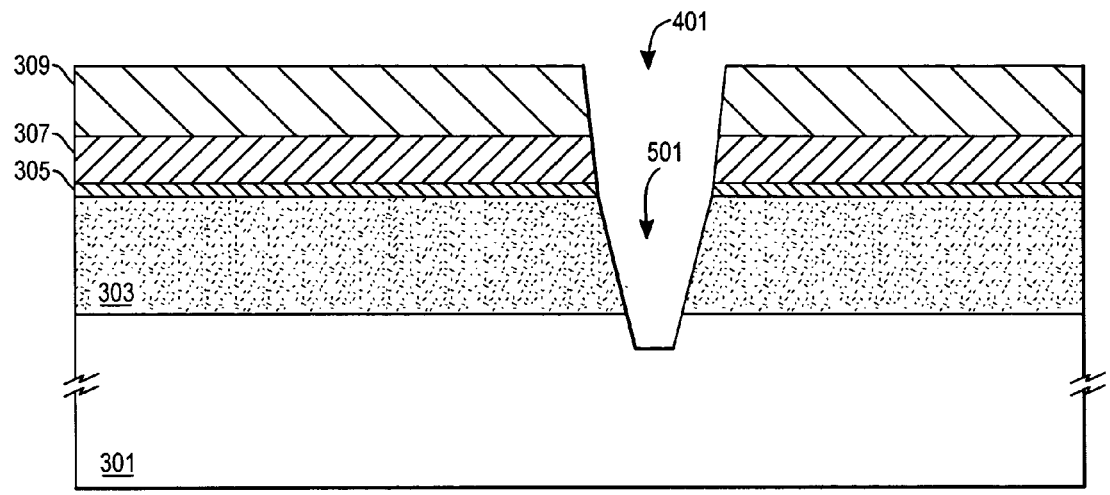
Fig._5
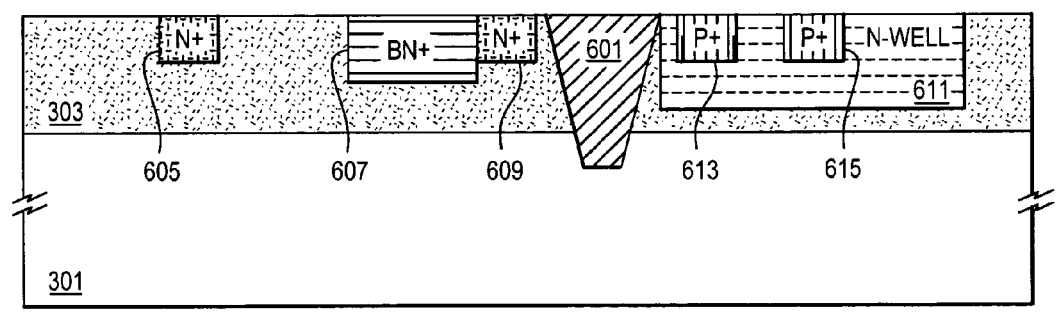
Fig._6

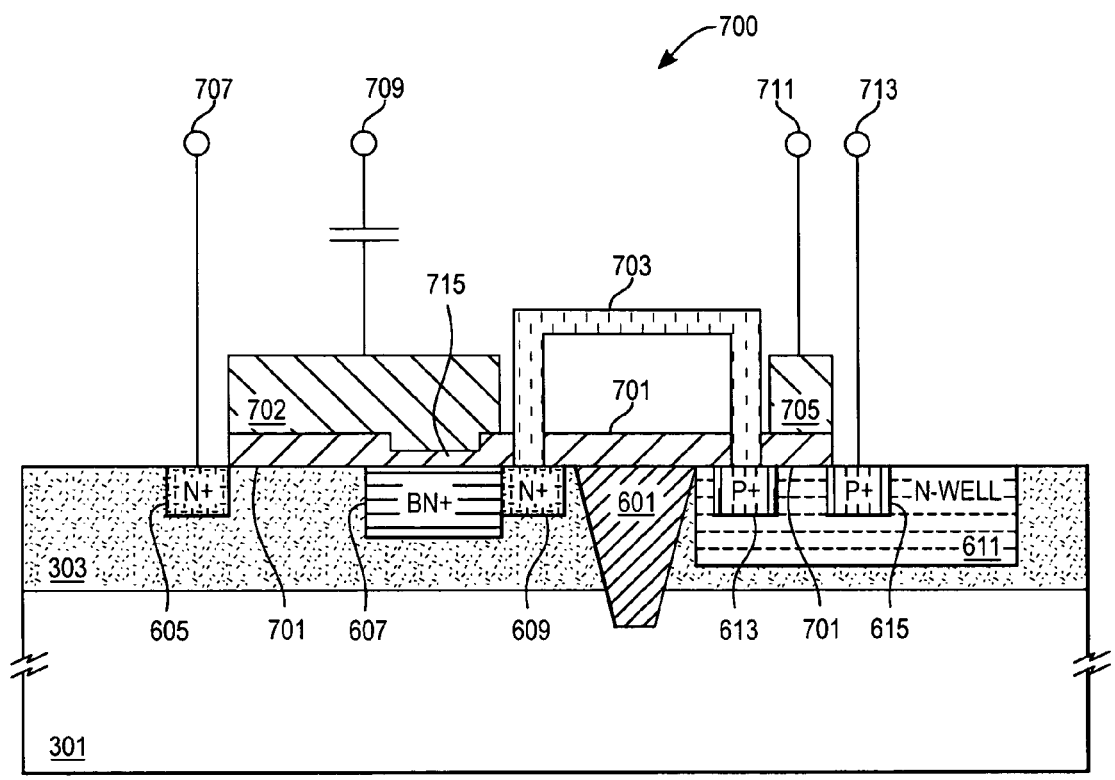
Fig. _ 7

LOW-VOLTAGE SINGLE-LAYER POLYSILICON EEPROM MEMORY CELL

TECHNICAL FIELD

A present invention described herein relates generally to a process for fabricating an integrated circuit structure, and more specifically to an electronic memory device, a process for manufacture, and a method of use thereof.

BACKGROUND ART

Semiconductor memory devices are typically classified into volatile memory devices and non-volatile memory devices. Volatile memory devices are subdivided into dynamic random access memories (DRAMs) and static random access memories (SRAMs). Non-volatile memory types include mask read-only memories (MROMs), programmable read-only memories (PROMs), erasable programmable read-only memories (EPROMs), and electrically erasable programmable read-only memories (EEPROMs). EEPROMs are increasingly used in system programming that requires continuous update or auxiliary memory devices. Particularly, flash EEPROMs are advantageous as mass storage devices because their integration density is high compared with conventional EEPROMs.

FIG. 1 shows a prior art EEPROM memory cell 100. The memory cell 100 includes an NMOS select transistor 101, an NMOS memory transistor 103, a bit line terminal 105, an NMOS—NMOS drain junction 107, and a source terminal 109. A contemporary EEPROM uses NMOSfets for both the NMOS select transistor 101 and the NMOS memory transistor 103. Fabrication difficulties currently arise if different device types are employed. However, this same NMOS—NMOS arrangement requires a programming potential as high as 14 volts. Although the tunneling current through a typical 7 nanometer (nm) thick tunnel diode window can be injected with only 10 volts, the higher 14 volt programming potential is required due to a voltage drop across the select transistor 101. This voltage drop will depend on factors such as transistor threshold voltage and body effects, but can be about 3 volts or more. For example, a 14-volt programming pulse on the bit line terminal 105 may produce only 11 volts at the NMOS—NMOS drain junction 107.

Accordingly, what is needed is a way to provide an improved process and structure capable of programming an EEPROM device at about 10 volts, thereby allowing an integration into existing processes without adding additional or complex masks. Such a device would also, for example, allow for EEPROM integration into a 3.3 volt CMOS technology. Such a structure must be economical to manufacture and readily adaptable to contemporary integrated circuit fabrication facilities.

DISCLOSURE OF THE INVENTION

A voltage drop across an NMOS select device can be greatly reduced or eliminated by utilizing a PMOS transistor as a select device. For example, a PMOS transistor is activated (i.e., turned "on") by lowering a gate voltage to 0 volts. In the activated state, there is essentially no voltage drop between the source and drain, thereby allowing the full source voltage to be transmitted to the drain. Therefore, the memory cell can be programmed using a reduced bit line voltage.

The present invention is a method of fabricating an electronic memory cell. The method of fabrication comprises implanting a first drain dopant region and a first source dopant region into an uppermost side of a semiconducting substrate. The semiconductor substrate may contain a p-type epitaxial layer into which the dopant regions are formed. The first drain and the first source dopant regions are doped to provide donor sites (n-type). A second drain dopant region and a second source dopant region are formed in an n-well in the epitaxial layer and are doped to provide acceptor sites (p-type). A shallow trench isolation region is formed substantially between the first drain/first source dopant regions and the second drain/second source dopant regions. The first drain dopant region is then electrically coupled to the second drain dopant region. Additional process steps, well-known to one skilled in the art, are added to fabricate a PMOS transistor from the second drain and second source dopant regions. The PMOS transistor serves as a select transistor in the memory cell and is configured to have an essentially zero voltage drop between the second source and second drain regions when the PMOS transistor is in an activated state. An NMOS transistor is fabricated from the first drain and first source dopant regions; the NMOS transistor is configured to serve as a memory transistor in the memory cell.

The present invention is also an electronic memory cell comprising a first transistor configured to be coupled to a bit line. The first transistor has an essentially zero voltage drop when activated and is configured to control an operation of the memory cell. A second transistor is configured to operate as a memory transistor and is coupled to the first transistor. The second transistor is further configured to be coupled to a word line and is configured to be programmable with a voltage about equal to a voltage on the bit line.

BRIEF DESCRIPTION OF THE FIGURES

FIG. 1 shows a prior art EEPROM cell.
FIG. 2 shows an EEPROM cell of the present invention.
FIG. 3 shows a cross-sectional exemplary embodiment of beginning steps in producing the EEPROM cell of FIG. 2 with a base substrate and epitaxial silicon.
FIG. 4 shows the film stack of FIG. 4 etched to allow production of a shallow trench isolation (STI) region.
FIG. 5 shows an etched trench in the silicon underlying the etched portion of the film stack of FIG. 5.
FIG. 6 shows the trench of FIG. 6 filled and planarized, completing the STI region, and dopant regions implanted or diffused into the epitaxial region.
FIG. 7 shows a cross-sectional exemplary embodiment of the EEPROM cell of FIG. 2 after completion of major processing steps.

BEST MODE FOR CARRYING OUT THE INVENTION

FIG. 2 shows an exemplary EEPROM memory cell 200 of the present invention. The memory cell 200 includes a PMOS select transistor 201, an NMOS memory transistor 203, a bit line terminal 205, a PMOS-NMOS drain junction terminal 207, and a source terminal 209. The PMOS-NMOS drain junction terminal 207 may not necessarily be an actual physical terminal, but rather, is used herein as an abstraction to more fully discuss programming the memory cell 200, infra.

When the PMOS select transistor 201 is activated (i.e., turned "on") by lowering a voltage at the select gate to 0 volts, there is essentially no voltage drop between the source and drain, thereby allowing a full source voltage (e.g., 10 volts) applied at the bit line terminal 205 to be transmitted to the PMOS-NMOS drain junction terminal 207 and applied to a drain of the NMOS memory transistor 203. Therefore, the memory cell can be programmed using a reduced bit line voltage.

With reference to FIGS. 3–7, an exemplary embodiment of the present invention is described in detail according to the following process steps. FIG. 3 includes a cross-section of a film stack applied over a base substrate 301, and an epitaxial deposition layer 303. The film stack includes a pad oxide 305, a nitride layer 307, and a photoresist layer 309. As is known in the art, the pad oxide 305 functions as a cushion to avoid stresses between the base substrate 301 and the nitride layer 305. The nitride layer 305 serves as an etch mask for formation of a shallow trench isolation (STI) structure, described infra. In a specific exemplary embodiment, the pad oxide 305 is thermally grown and is 10 nm–50 nm thick, the nitride layer 307, typically deposited by low-pressure chemical vapor deposition (LPCVD) techniques, is 30 nm–100 nm thick, and the photoresist layer 309 is spun-on and is up to 1 micrometer (μm) thick. Alternatively, a single oxide layer (not shown) may be deposited or grown and may take the place of the joint pad oxide/nitride stack 305, 307. In either case, the photoresist layer 309 is then lithographically patterned in preparation for an STI etch.

The base substrate 301 is frequently a silicon wafer. In this embodiment, the silicon wafer contains a p-type dopant. Alternatively, another elemental group IV semiconductor or compound semiconductor (e.g., groups III–V or II–VI) may be selected for base substrate 301. For a p-type silicon base substrate 301, the epitaxial deposition layer will also contain a p-type dopant.

With reference to FIG. 4, the film stack is etched by exposing and developing the photoresist layer 309, and etching through the photoresist layer 309, underlying nitride 307, and oxide 305 layers, thereby producing an STI etch mask window 401. The nitride 307 and oxide 305 layers are etched through various etching techniques, such as a wet etch (e.g., in hydrofluoric, such as contained in a standard buffered oxide etch, or orthophosphoric acid) or dry etch (e.g., reactive-ion etch (RIE)) techniques. Silicon (both the epitaxial layer 303 and the base substrate 301 underlying the etch mask window 401) is then etched (for example, by nitric or hydrofluoric acid, potassium hydroxide (KOH), or tetra-methyl ammonium hydroxide (TMAH)). The etched silicon forms a silicon trench 501 (FIG. 5). In a specific embodiment, a width of the silicon trench, measured at an uppermost surface of the epitaxial deposition layer 303, is at least about 2.3 μm.

The photoresist layer 309 is stripped and an oxide is deposited (e.g., by a chemical vapor deposition (CVD) process), filling the silicon trench 501. Alternatively, an undoped silicate glass (USG) may be used to fill the silicon trench 501. The nitride 307 and pad oxide 305 layers are stripped and the silicon trench 501 fill material is then planarized (e.g., by a chemical mechanical planarization (CMP) process), leaving the silicon trench 501 fill material essentially co-planar with an uppermost surface of the epitaxial deposition layer 303. A final STI structure 601 (FIG. 6) electrically isolates subsequently implanted or diffused dopant regions.

FIG. 6 includes a memory transistor source doped region 605, a memory transistor gate dopant region 607, a memory transistor drain dopant region 609, an n-well structure 611, a select transistor drain dopant region 613, and a select transistor source dopant region 615. All doped regions are formed by processes well-known to one of skill in the art and may be either implanted or diffused dopant regions. In a specific exemplary embodiment, the dopant regions are about 0.2 micrometers (μm) in depth. The STI structure 601 isolates the memory transistor drain dopant region 609 from the select transistor drain dopant region 613.

The memory transistor source 605 and drain dopant regions 609 are implanted with an n-type dopant (n+) and the memory transistor gate dopant region 607 is a buried n-type (n+). The memory transistor gate dopant region 607 is used to form the bottom plate of a coupling capacitor and a heavily-doped region for a tunnel diode window (TDW), discussed with respect to FIG. 7, infra. A p-type epitaxial deposition layer 303 allows formation of the NNOS memory transistor without separate p-well implantation steps. To form the PMOS transistor 201 (FIG. 2) used for the select transistor, a p-type dopant is used in both the select transistor drain 613 and source 615 dopant regions. Both of the select transistor dopant regions are formed within the n-well structure 611.

FIG. 7 shows a cross-sectional EEPROM memory cell 700 after completion of major processing steps. The EEPROM memory cell 700 includes a gate oxide 701, an NMOS polysilicon gate layer 702, a metal drain coupling structure 703, a PMOS polysilicon gate layer 705, an NMOS source terminal 707, a sense gate terminal 709, a select gate terminal 711, a PMOS bit line terminal 713, and a tunnel diode window (TDW) 715.

The gate oxide 701 is either thermally grown or CVD deposited. After the gate oxide growth, an opening is made to form, inter alia, the TDW 715. A brief thermal oxidation is then performed to regrow a thin tunnel oxide in the TDW 715. In a specific embodiment, the tunnel oxide is approximately 7 nm thick. The metal drain coupling structure 703 is formed to electrically couple the memory transistor drain dopant region 609 to the select transistor drain dopant region 613. The metal drain coupling structure 703 is formed by processes well-known to a skilled artisan and briefly involves, for example, depositing a CVD nitride (or, alternatively, some other dielectric) layer, patterning and etching contact vias in the nitride (one above the drain dopant region 309, 313 of each transistor), depositing a titanium nitride (TiN) or titanium (Ti) liner on interior walls of the via, and depositing a tungsten (W) or copper (Cu) plug within the lined via. Finally, an aluminum or copper interconnect is constructed to electrically couple the two vias, and the nitride layer is stripped. The polysilicon gate layers 702, 705 are typically deposited by a CVD process.

The various transistor component terminals 707, 709, 711, 713 may not necessarily be actual physical terminals, but rather, are used herein as an abstraction to more fully discuss programming the memory cell 700, infra. Metallization steps (not shown), known to one of skill in the art, will provide actual connection terminals in later process steps.

Following the completion of major processing steps shown in FIG. 7, techniques well known to a skilled artisan are used to perform, for example, additional metallization, electronic-test, and packaging steps to complete the semiconductor memory cell device.

With reference to table 1, infra, exemplary programming and resulting voltages for the memory cell 200 of FIG. 2 are shown. Applying approximately 10 volts to the bit line terminal 205, 0 volts to the select gate, and 0 volts at the sense gate allows a write operation to occur. During a write operation, an electrical potential at the PMOS-NMOS drain junction terminal 207 is 10 volts, indicating a 0 volt drop across the PMOS select transistor 201. A voltage at the source terminal 209 is allowed to float. The sense gate terminal 709 is at zero voltage and the NMOS polysilicon gate layer 702 is negative with respect to memory transistor gate dopant region 607. Electrons tunnel from the polysilicon gate layer 702 to memory gate dopant region 607 (i.e., the buried n+ dopant region), thereby lowering a threshold voltage of the memory transistor 203.

TABLE 1

|  | WRITE | ERASE | READ |
|---|---|---|---|
| BIT LINE VOLTAGE | 10 V | FLOAT | 1 V |
| SELECT GATE VOLTAGE | 0 V | 0 V OR 10 V | 0 V |
| RESULTING VOLTAGE AT PMOS-NMOS DRAIN JUNCTION TERMINAL (FOR REFERENCE ONLY) | 10 V | 0 V | 1 V |
| SENSE GATE VOLTAGE | 0 V | 10 V | 0 V |
| SOURCE VOLTAGE | FLOAT | 0 V | 0 V |

An erase operation is effected by allowing the bit line terminal 205 to float, applying either 0 volts or 10 volts to the select gate, applying 0 volts at the source terminal 209, and 10 volts to the sense gate. The NMOS polysilicon gate layer 702 is positive with respect to the memory source dopant region 605 and a channel is formed that links the memory source 605 to the memory gate dopant region 607 and the memory drain dopant region 609. Therefore, the memory drain dopant region 609, channel, and source dopant region 605 are all at 0 volts. The voltage across the polysilicon gate layer 702 and the memory gate dopant region 607 is approximately 10 volts. Electrons tunnel from the memory gate dopant region 607 to the polysilicon gate layer 702, thereby increasing a threshold voltage of the memory transistor 203.

A read operation is effected by applying 1 volt to the bit line terminal 205, applying 0 volts to the select gate, applying 0 volts at the source terminal 209, and 0 volts to the sense gate. If the memory cell 200 has been erased, a threshold voltage, $V_t$, is approximately 2.3 volts and the current flow will be negligible through the memory cell 200.

To facilitate an understanding of the present invention, a process and arrangement for forming a low-voltage EEPROM memory cell has been discussed herein. However, the invented process and arrangements of layers and regions described herein may be readily modified to utilize other device types while still allowing advantages of the present invention presented herein. For example, although an embodiment depicts a PMOS-NMOS configuration for fabrication a memory cell, a skilled artisan will recognize that the present invention is readily adaptable to a PMOS—PMOS configuration while still realizing the low programming voltage advantage over the prior art.

Additionally, although process steps and techniques are shown and described in some detail, a skilled artisan will recognize that other techniques and methods may be utilized which are still included within the scope of the appended claims. For example, there are frequently several techniques used for depositing a film layer (e.g., chemical vapor deposition, plasma-enhanced vapor deposition, epitaxy, atomic layer deposition, etc.). Although not all techniques are amenable to all film types described herein, one skilled in the art will recognize that multiple methods for depositing a given layer and/or film type may be used. Further, as known to a skilled artisan, dopant regions may be either implanted or diffused.

What is claimed is:

1. A method of fabricating an electronic memory cell comprising:
    producing a first drain dopant region and a first source dopant region in an uppermost side of a semiconducting substrate, the first drain and first source dopant regions being doped to provide donor sites;
    producing a second drain dopant region and a second source dopant region in an uppermost side of a semiconducting substrate, the second drain and second source dopant regions being doped to provide acceptor sites;
    constructing a shallow trench isolation region substantially between the first drain/first source dopant regions and the second drain/second source dopant regions;
    coupling the first drain dopant region to the second drain dopant region to communicate electrically;
    fabricating a PMOS transistor from the second drain and second source dopant regions, the PMOS transistor serving as a select transistor in the memory cell, the PMOS transistor being further configured to have an essentially zero voltage drop between the second source and second drain regions when the PMOS transistor is in an activated state; and
    fabricating an NMOS transistor from the first drain and first source dopant regions, the NMOS transistor configured to serve as a memory transistor in the memory cell.

2. The method of fabricating an electronic memory cell of claim 1 further comprising fabricating a tunnel diode window wherein the tunnel diode window is about 7 nanometers in thickness.

3. The method of fabricating an electronic memory cell of claim 1 wherein all the dopant regions are formed within an epitaxial p-type layer which is an uppermost side of the semiconducting substrate.

4. The method of fabricating an electronic memory cell of claim 1 wherein the memory transistor is configured to operate with a programming voltage of about 10 volts.

5. The method of fabricating an electronic memory cell of claim 1 further comprising fabricating an n-well which forms a portion of the select transistor.

6. The method of fabricating an electronic memory cell of claim 1 wherein the shallow trench isolation region is formed from undoped silicate glass.

7. The method of fabricating an electronic memory cell of claim 1 wherein the shallow trench isolation region is formed from silicon dioxide.

8. The method of fabricating an electronic memory cell of claim 1 wherein the second drain dopant region and the second source dopant region are produced in an n-well fabricated within the uppermost side of the semiconducting substrate.

9. A method of fabricating an electronic memory cell comprising:
    depositing a p-type epitaxial layer on an uppermost side of a semiconducting substrate;
    producing a first drain dopant region and a first source dopant region in the epitaxial layer, the first drain and first source dopant regions being doped to provide donor sites;
    producing a second drain dopant region and a second source dopant region in the epitaxial layer, the well being doped with donor sites and large enough to surround the second drain dopant region and the second source dopant region;

constructing a shallow trench isolation region substantially between the first drain/first source dopant regions and the second drain/second source dopant regions;

coupling the first drain dopant region to the second drain dopant region to communicate electronically;

fabricating a PMOS transistor from the second drain and second source dopant regions, the PMOS transistor serving as a select transistor in the memory cell, the PMOS transistor being further configured to have an essentially zero voltage drop between the second source and second drain regions when the PMOS transistor is in an activated state; and fabricating an NMOS transistor from the first drain and first source dopant regions, the NMOS transistor configured to serve as a memory transistor in the memory cell, the memory transistor being configured to operate with a programming voltage of about 10 volts.

10. The method of fabricating an electronic memory cell of claim 9 wherein the shallow trench isolation region is formed from undoped silicate glass.

11. The method of fabricating an electronic memory cell of claim 9 wherein the shallow trench isolation region is formed from silicon dioxide.

12. The method of fabricating an electronic memory cell of claim 9 wherein the memory cell is fabricated without a threshold voltage dopant region.

* * * * *